US012666978B2

(12) United States Patent
Tai et al.

(10) Patent No.: US 12,666,978 B2
(45) Date of Patent: Jun. 23, 2026

(54) SEMICONDUCTOR PACKAGE STRUCTURE AND METHOD FOR FORMING THE SAME

(71) Applicant: TAIWAN SEMICONDUCTOR MANUFACTURING COMPANY LTD., Hsinchu (TW)

(72) Inventors: Chih-Hsuan Tai, Taipei City (TW); Hsiang-Tai Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 584 days.

(21) Appl. No.: 18/167,882

(22) Filed: Feb. 12, 2023

(65) Prior Publication Data

US 2024/0274541 A1      Aug. 15, 2024

(51) Int. Cl.

| | |
|---|---|
| *H10W 70/60* | (2026.01) |
| *H10B 80/00* | (2026.01) |
| *H10P 74/00* | (2026.01) |
| *H10P 74/20* | (2026.01) |
| *H10W 70/63* | (2026.01) |
| *H10W 74/01* | (2026.01) |
| *H10W 74/10* | (2026.01) |
| *H10W 90/00* | (2026.01) |
| *H10W 72/90* | (2026.01) |
| *H10W 80/00* | (2026.01) |

(52) U.S. Cl.

CPC .......... *H10W 70/611* (2026.01); *H10B 80/00* (2023.02); *H10P 74/203* (2026.01); *H10P 74/273* (2026.01); *H10W 70/635* (2026.01); *H10W 74/016* (2026.01); *H10W 74/111* (2026.01); *H10W 90/00* (2026.01); *H10W 90/701* (2026.01); *H10W 72/9415* (2026.01); *H10W 80/743* (2026.01); *H10W 90/724* (2026.01)

(58) Field of Classification Search

CPC ... H01L 23/5384; H01L 21/565; H01L 22/12; H01L 22/32; H01L 23/3107; H01L 23/49816; H01L 24/08; H01L 24/16; H01L 25/0655; H01L 25/50; H01L 2224/08112; H01L 2224/16227; H01L 2924/1436; H01L 2924/1437; H01L 25/16; H01L 2225/1058; H01L 23/3128; H10B 80/00

See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |

(Continued)

*Primary Examiner* — Thanh Y. Tran

(74) *Attorney, Agent, or Firm* — WPAT LAW; Anthony King

(57) ABSTRACT

A semiconductor package structure includes an interposer, an IPD package, a plurality of detecting bumps, and a plurality of daisy chains. The interposer includes at least a detecting pad and a plurality of bonding pads. The IPD package includes a plurality of metal bumps. The detecting bumps are disposed in the IPD package and separated from the metal bumps of the IPD package. The daisy chains are disposed in the IPD package and electrically connected to the detecting bumps.

20 Claims, 13 Drawing Sheets

(56) References Cited

U.S. PATENT DOCUMENTS

| | | | | |
|---|---|---|---|---|
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,496,189 | B2 | 11/2016 | Yu et al. | |
| 11,073,550 | B1 * | 7/2021 | Gong | G01R 31/2896 |
| 2022/0344225 | A1 * | 10/2022 | Hsieh | H01L 24/81 |

* cited by examiner

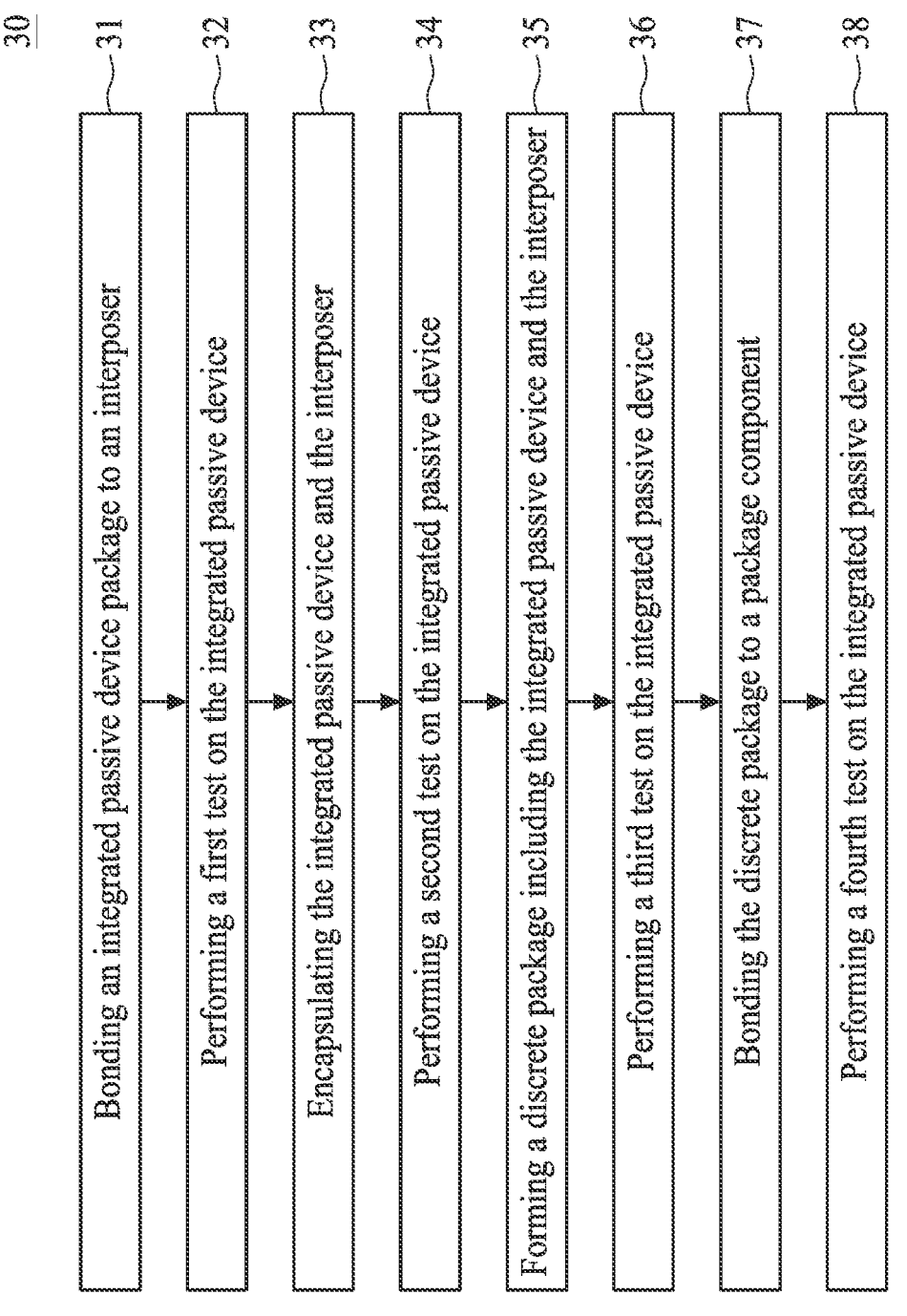

30

31 Bonding an integrated passive device package to an interposer

32 Performing a first test on the integrated passive device

33 Encapsulating the integrated passive device and the interposer

34 Performing a second test on the integrated passive device

35 Forming a discrete package including the integrated passive device and the interposer 36 Performing a third test on the integrated passive device 37 Bonding the discrete package to a package component 38 Performing a fourth test on the integrated passive device

FIG. 13

SEMICONDUCTOR PACKAGE STRUCTURE AND METHOD FOR FORMING THE SAME

BACKGROUND

Integrated circuit packaging is becoming increasing complex, with more device dies incorporated in a same package to form a system having more functions. Device dies, packages, and independent passive devices (IPDs) may be incorporated in the same package to achieve the desirable functionality.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flowchart representing a method for forming a semiconductor package structure according to aspects of the present disclosure.

DETAILED DESCRIPTION

Figure 1:
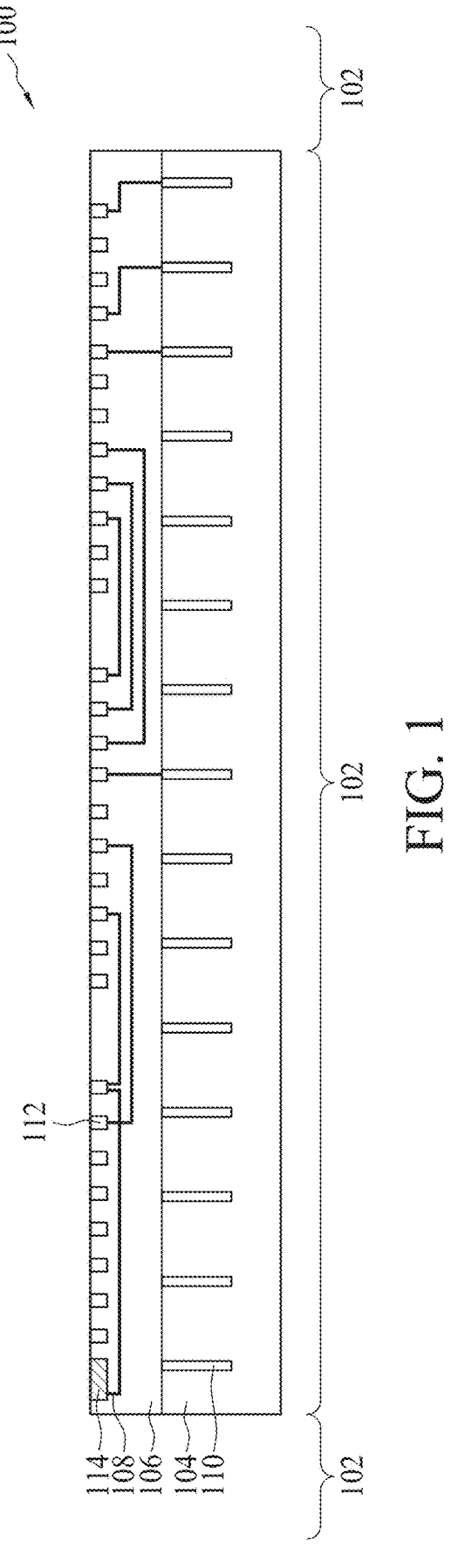
FIGS. 1, 2 and 5 to 12 are schematic cross-sectional views of various stages in a formation of a semiconductor package structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective test measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In an attempt to increase circuit density, three-dimensional (3D) ICs have been developed. In a formation process of a 3D IC, two dies are bonded together and electrical connections are formed between each die and contacts on a substrate. In some comparative approaches, interposer stacking is a part of 3D IC technology, wherein a through-silicon via (TSV) embedded interposer may be used to connect a device silicon with a micro bump. In some embodiments such as a chip-on-wafer-on-substrate (CoWoS) process flow, a device silicon chip is first attached onto a silicon interposer wafer, and then to a substrate.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Further, integrated passive devices (IPDs) are provided and integrated into CoWoS packages and other 3DIC packages. In some comparative approaches, it is found that during the forming of the packages having the IPDs, an IPD crack may be generated during molding compound grinding. However, in such comparative approaches, such die crack issue cannot be monitored in real time, causing the loss of an entire high-cost component of the package.

In some embodiments of the present disclosure, the present disclosure provides a semiconductor package structure including detecting devices and a method for forming the same. According to the method, the semiconductor package structure is monitored for detects during manufacturing processes. Based on such monitoring, it can be determined whether it is economically beneficial to repair a defective package structure through a rework process at an intermediate stage rather than discarding a completed but defective semiconductor package structure.

Advantageous features of some or all of the embodiments described herein may include shorter distances between IPDs and functional dies, which may enhance performance of a power distribution network (PDN). Some embodiments may provide integration of 3D stacked IPDs with InFO processes, thus making adoption of the embodiments practical. In some embodiments, 3D stacking of IPDs avoids the need to remove ball grid array (BGA) connectors from a socket landscape (e.g., a footprint of a package), allowing for improved current handling through increased area (e.g., through more BGA connectors) for current handling.

FIGS. 1, 2 and 5 to 12 are schematic cross-sectional views of various stages in a formation of a semiconductor package structure according to aspects of the present disclosure in one or more embodiments. The corresponding operations are also reflected schematically in the process flow shown in FIG. 13.

FIG. 1 is a schematic cross-sectional view of a semiconductor package structure according to aspects of the present disclosure in one or more embodiments. In some embodiments, the semiconductor package structure includes an interposer wafer 100 (also referred to as an interposer), which is formed based on a substrate. In some embodiments, the interposer wafer 100 may be formed free of active devices such as transistors and diodes. In some embodiments, the interposer wafer 100 may be formed free of passive devices such as capacitors, inductors, resistors, or the like. In some alternative embodiments, the interposer wafer may include passive devices, if needed. In some embodiments, the interposer wafer 100 may include a plurality of identical regions 102.

In some embodiments, each of the identical regions 102 of the interposer wafer 100 may have conductive lines formed in dielectric layers. In some embodiments, the dielectric layers may include low-k dielectric materials; as a result, the conductive lines have low impedance values. In some embodiments, the interposer wafer 100 may be formed of laminate substrate or cored or coreless substrate, which may include organic dielectric materials. Further, redistribution layers or redistribution lines may be formed in the organic dielectric material. In some embodiments, the organic dielectric material includes polymer, such as polyimide, polybenzoxazole (PBO), benzocyclobutene (BCB), or the like. In some embodimetns, the redistribution layers or redistribution lines may include polyimide, polybenzoxazole (PBO), benzocyclobutene (BCB), or the like.

In some embodiments, the interposer wafer 100 includes a substrate 104 such as a semiconductor substrate, an organic substrate, a glass substrate, a laminate substrate, or the like. In some embodiments, when the substrate 104 includes the semiconductor substrate, the substrate 104 may include, for example but not limited thereto, crystalline silicon, crystalline germanium, crystalline silicon germanium, and/or III-V compound semiconductor material such as GaAsP, AlInAs, AlGaAs, GaInAs, GaInP, GaInAsP, and the like. In some embodiments, dielectric layers 106 and conductive lines 108 may be formed over the substrate 104. The dielectric layer 106 may include silicon oxide, silicon nitride, silicon carbide, silicon oxynitride, silicon oxy-carbide, silicon oxy-nitride, silicon-oxy-carbo-nitride, undoped silicate glass (USG), or the like. The conductive lines 108 are formed in the dielectric layers 106. The conductive lines 108 may include a copper alloy, tungsten, cobalt, or the like. In some embodiments, an interconnect structure formed over the substrate 104 may include the dielectric layer 106 and the conductive lines 108. In other embodiments, redistribution layers formed over the substrate 104 may include the dielectric layer 106 and the conductive lines 108.

Further, in such embodiments, a plurality of through vias 110 are formed in the substrate 104. As shown in FIG. 1, the through vias 110 may be coupled to the conductive lines 108.

Still referring to FIG. 1, in some embodiments, the interposer wafer 100 includes a plurality of bonding pads 112, wherein the conductive lines 108 are coupled to the bonding pads 112. The conductive lines 108 serve as electrical paths that provide electrical connections between two or more of the bonding pads 112 and/or between the bonding pads 112 and the through vias 110.

In some embodiments, the interposer wafer 100 further includes at least one detecting pad 114. The detecting pad 114 may be formed by operations similar to those applied for forming the bonding pads 112. In some embodiments, materials for forming the detecting pad 114 are identical to those for forming the bonding pads 112, but the disclosure is not limited there. A size of the detecting pad 114 may be same as a size of the bonding pad 112, but the disclosure is not limited thereto. For example, in some embodiments, the size of the detecting pad 114 may be greater than the size of the bonding pad 112. Further, in some embodiments, the detecting pad 114 is electrically connected to the bonding pads 112 through the electrical paths formed by the conductive lines 108.

Figure 2:
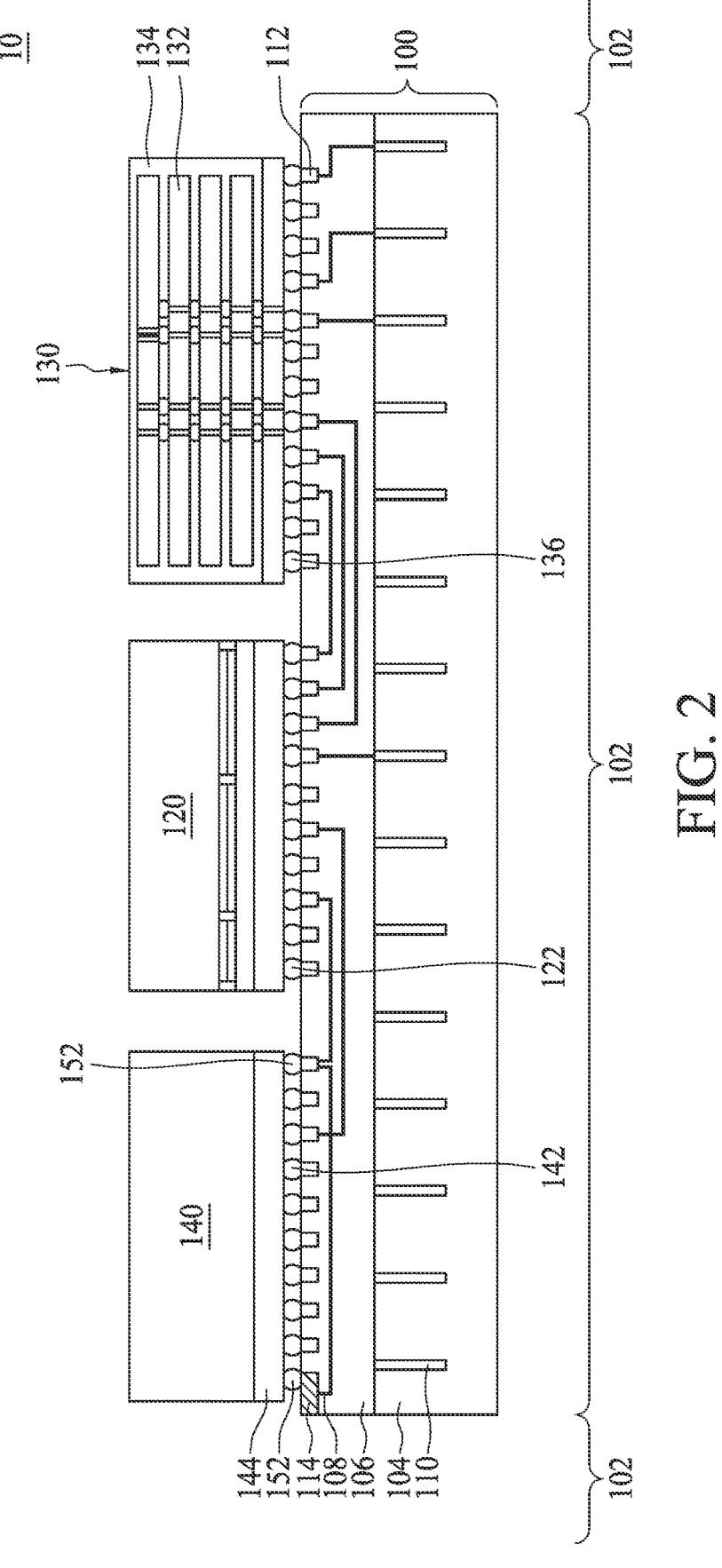

Please refer to FIG. 2. In some embodiments, various package components such as dies or packages may be disposed over and bonded to the interposer wafer 100. For example, a device die 120 or a core-device-containing package (such as a system-on-chip (SoC) package) 120 (including device dies bonded together to form a system) is bonded to the interposer 100. The device die 120 or the device dies in the SoC package 120 may include core device dies such as center computing unit (CPU) dies, central processing unit (CPU) dies, graphics processing unit (GPU) dies, application specific integrated circuit (ASIC) dies, field programmable gate array (FPGA) dies, the like, or combinations thereof. When a SoC package 120 includes a single device die, the device die includes multiple components on a same substrate, which may include a CPU, memory, input/output ports and secondary storage. The single device die 120 may also integrally contain digital, analog, mixed-signal, and sometimes radio frequency signal-processing functions. The device die and the device dies in the SoC package 120 are not shown in detail in FIG. 2.

In some embodiments, various package components such as a memory die or a memory package (such as a high-bandwidth memory (HBM) cube) 130 may be disposed over and bonded to the interposer wafer 100. The memory package 130 may include stacked memory dies 132 such as dynamic random-access memory (DRAM) dies, static random-access memory (SRAM) dies, resistive random-access memory (RRAM) dies, or other types of memory dies. In some embodiments, the memory dies 132 are stacked and bonded together, and an encapsulant 134 encapsulates the memory dies 132 therein, to form the memory package 130.

In some embodiments, various components such as an IPD 140 or an IPD package 140 are disposed over and bonded to the interposer wafer 100. The IPD package 140 may include capacitors (which may be de-coupling capacitors), inductors, resistors, and/or the like.

As shown in FIG. 2, the SoC package 120 may include metal bumps 122. The memory package 130 may include metal bumps 136. The IPD package 140 may include metal bumps 142. In some embodiments, the metal bumps 122, 136 and 142 may include copper, nickel, palladium, gold, composite layers thereof, and/or alloys thereof. The bonding between the SoC package 120 and the interposer wafer 100, between the memory package 130 and the interposer wafer 100, and between the IPD package 140 and the interposer wafer 100 are achieved by the metal bumps 122, 136 and 142. In some embodiments, the bonding between the dies/packages 120, 130, 140 and the interposer wafer 100 includes solder bonding, direct metal-to-meal bonding, hybrid bonding, or the like.

Additionally, a thickness of the device die or the SoC package 120, a thickness of the memory package 130 and a thickness of the IPD package 140 may be similar, as shown in FIG. 2, but the disclosure is not limited thereto.

Still referring to FIG. 2, in some embodiments, at least a detecting device 150 (shown in FIGS. 3A to 3C and 4A and 4B) is disposed in the IPD package 140. Each of the detecting devices 150 includes a plurality of detecting bumps 152 and a plurality of daisy chains 154 coupled to the detecting bumps 152. In some embodiments, the detecting bumps 152 may be formed by operations similar to those applied for forming the metal bumps 142, therefore materials for forming the detecting bumps 152 are same as materials for forming the metal bumps 142. In some embodiments, widths of the detecting bumps 152 are same as widths of the metal bumps 142, but the disclosure is not limited thereto. In some embodiments, a pitch between a detecting bump 152 and an adjacent metal bump 142 is same as a pitch between adjacent metal bumps 142, as shown in FIG. 2, but the disclosure is not limited thereto. In some embodiments, the detecting bump 152 of the detecting device 150 of the IPD package 140 may be bonded to a detecting pad 114 of the interposer 100. In other embodiments, the detecting bump 152 may be bonded to the bonding pad 112 of the interposer 100.

Figure 3C:
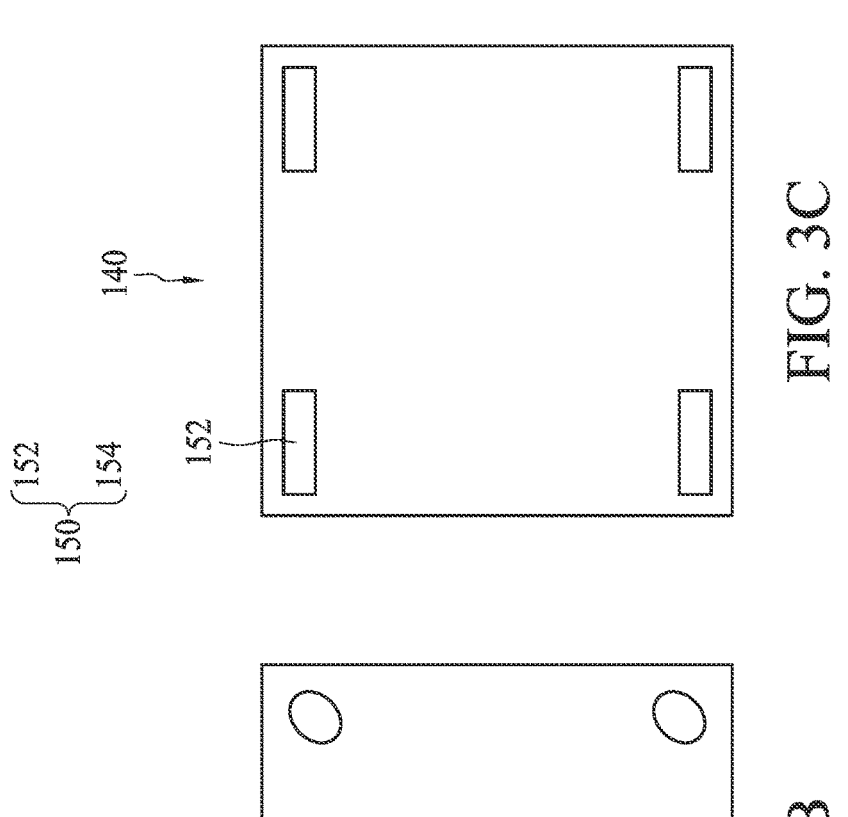
FIGS. 3A to 3C are bottom views illustrating arrangements of detect bumps according to aspects of the present disclosure in one or more embodiments.
Figure 3B:
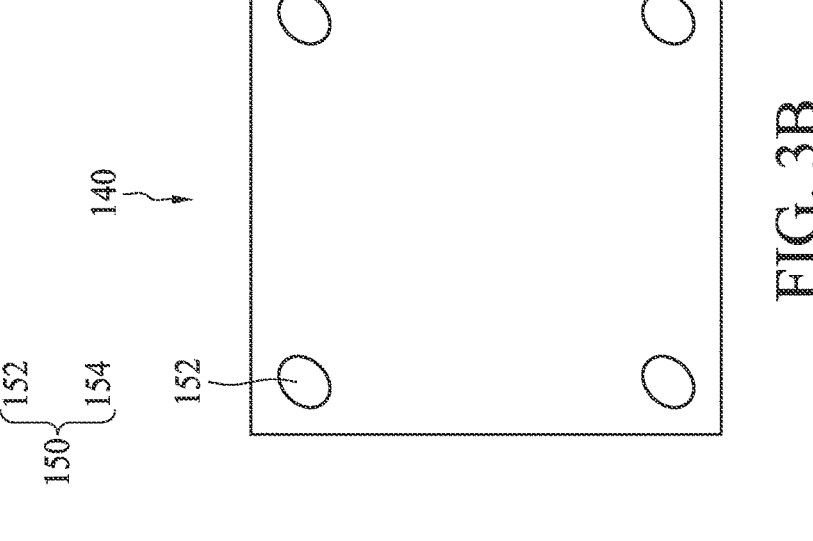
Figure 3A:
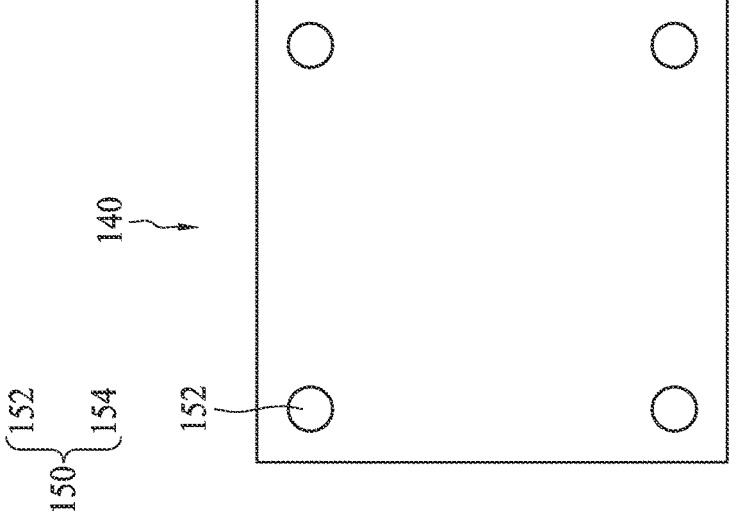

Please refer to FIGS. 3A to 3C, which are bottom views illustrating arrangements of the detecting bumps 152 according to aspects of the present disclosure in one or more embodiments. It should be noted that the metal bumps 142 are omitted from FIGS. 3A to 3C, however those skilled in the art would easily realize locations of the metal bumps 142 according to FIG. 2. In some embodiments, the detecting bumps 152 may include round bumps as shown in FIG. 3A. In other embodiments, the detecting bumps 152 may include oval bumps, as shown in FIG. 3B. In still other embodiments, the detecting bumps 152 may include stripe-shaped bumps, as shown in FIG. 3C. In some embodiments, when the IPD package 140 has a rectangular shape, the detecting bumps 152 are disposed at four corners of the IPD package 140, as shown in FIGS. 3A to 3C.

Figure 4B:
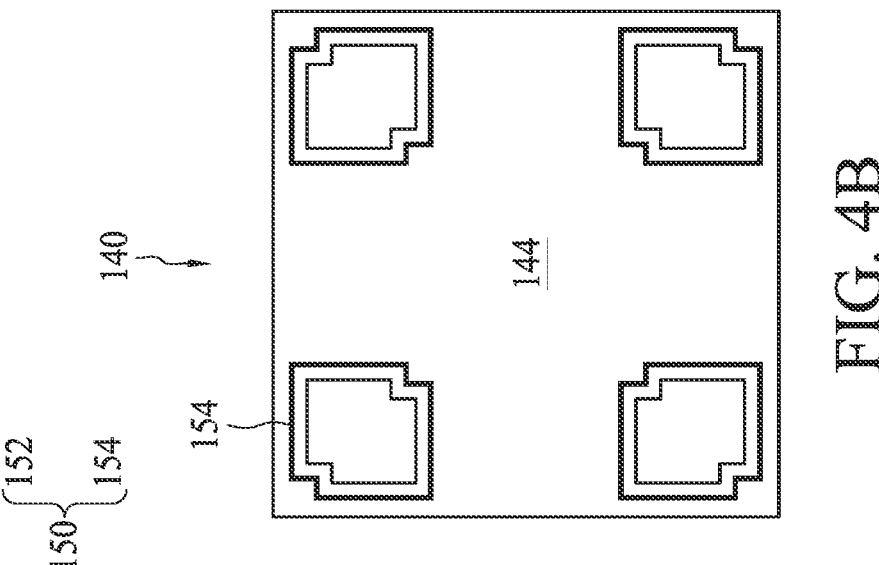
FIGS. 4A and 4B are bottom views illustrating arrangements of daisy chains according to aspects of the present disclosure in one or more embodiments.
Figure 4A:
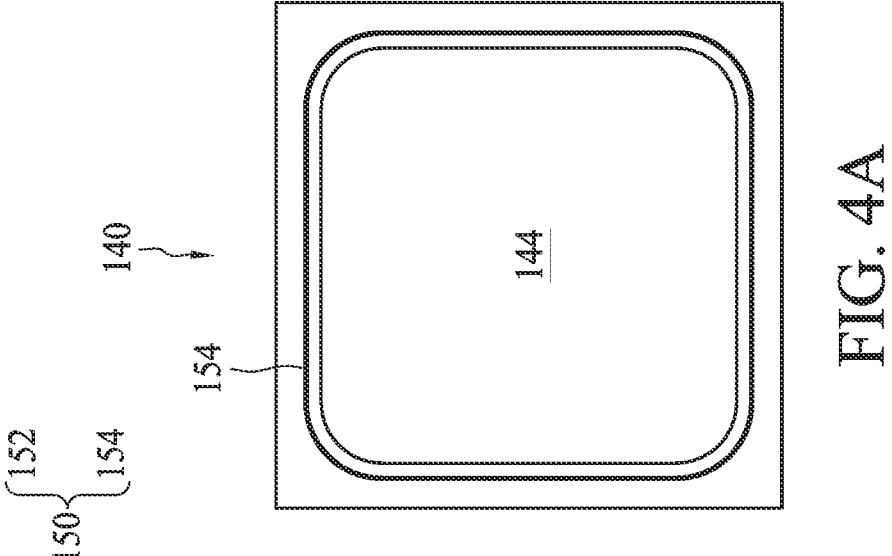

Please refer to FIGS. 4A and 4B, which are perspective bottom views of the IPD package 140 according to aspects of the present disclosure in one or more embodiments. As mentioned above, the detecting device 150 includes daisy chains 154, which are disposed in a dielectric layer 144 of the IPD 140. The daisy chains 154 are coupled to the detecting bumps 152. The daisy chains 154 may be formed simultaneously with a back side metallization layer (not shown) of the IPD 140. In some embodiments, the daisy chains 154 are formed to surround peripheral regions or edges of the rectangular IPD package 140, as shown in FIG. 4A. In other embodiments, the daisy chains 154 may be disposed over the four corners of the rectangular IPD package 140, as shown in FIG. 4B. Further, the detecting devices 150 (including the detecting bumps 152 and the daisy chains 154) are electrically isolated from other portions of metallization layers of the IPD package 140.

Figure 5:
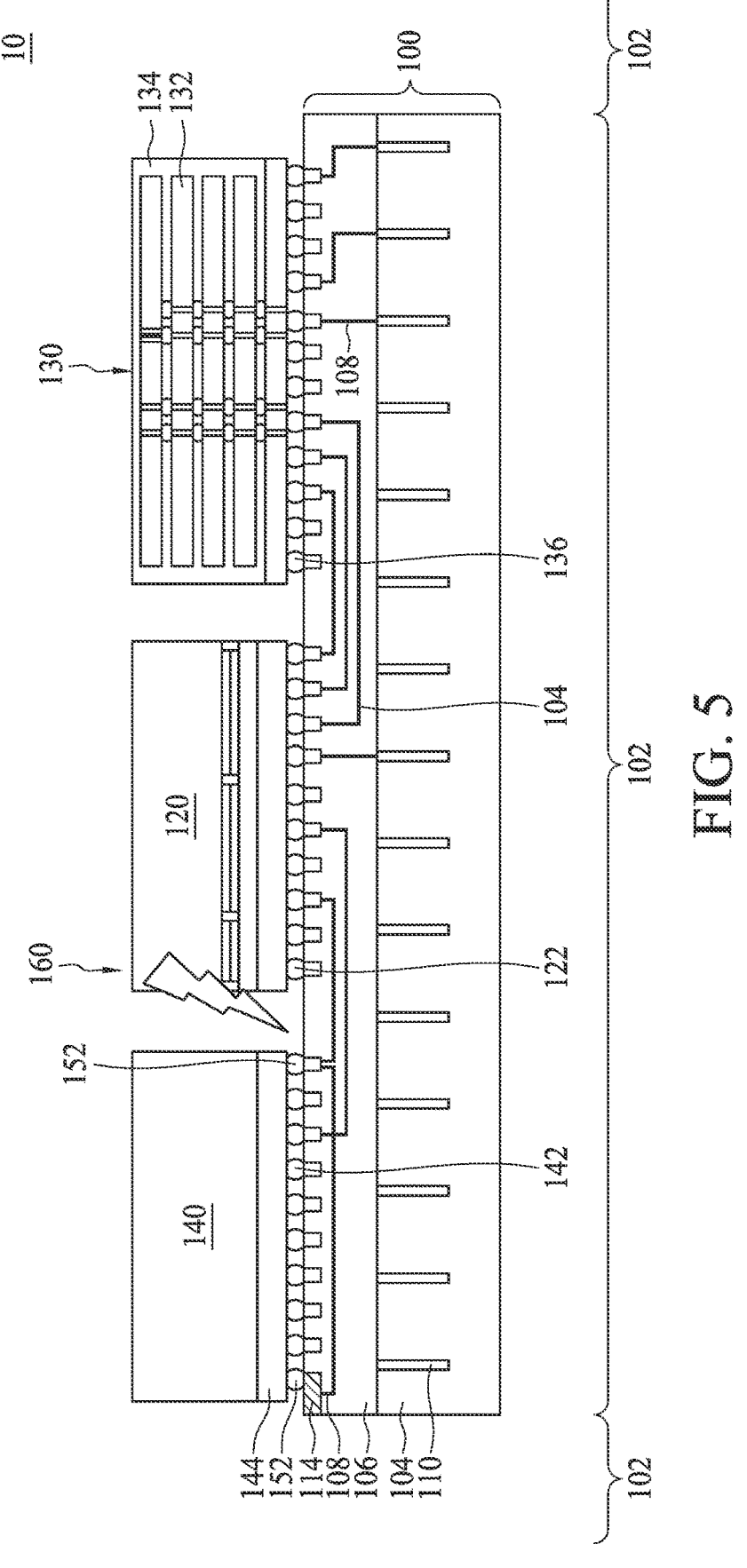

Referring to FIG. 5, during manufacturing, a test 160 may be performed to identify defective package components, such as the IPD package 140. It has been found that the IPD package 140 may suffer from cracking due to mechanical stress imposed during a bonding operation. Therefore, the test 160 is performed using a probe to couple to the detecting device 150 of the IPD package 140 through the detecting pad 114 and the detecting bump 152. In some embodiments, when a crack occurs during the bonding operation, the crack may extend into the dielectric layer 144 of the IPD package 140. The daisy chain 154 of the detecting device 150 is broken as a result, and thus the test 160 is failed. Accordingly, the test 160 may be used to detect the IPD packages 140 with crack issues. Instead of discarding the defective package structures, it may be economically beneficial to repair the defective package structures through a rework process by, for example, removing the IPD package 140 and bonding a replacement IPD package 140 to the interposer wafer 100.

Figure 6:
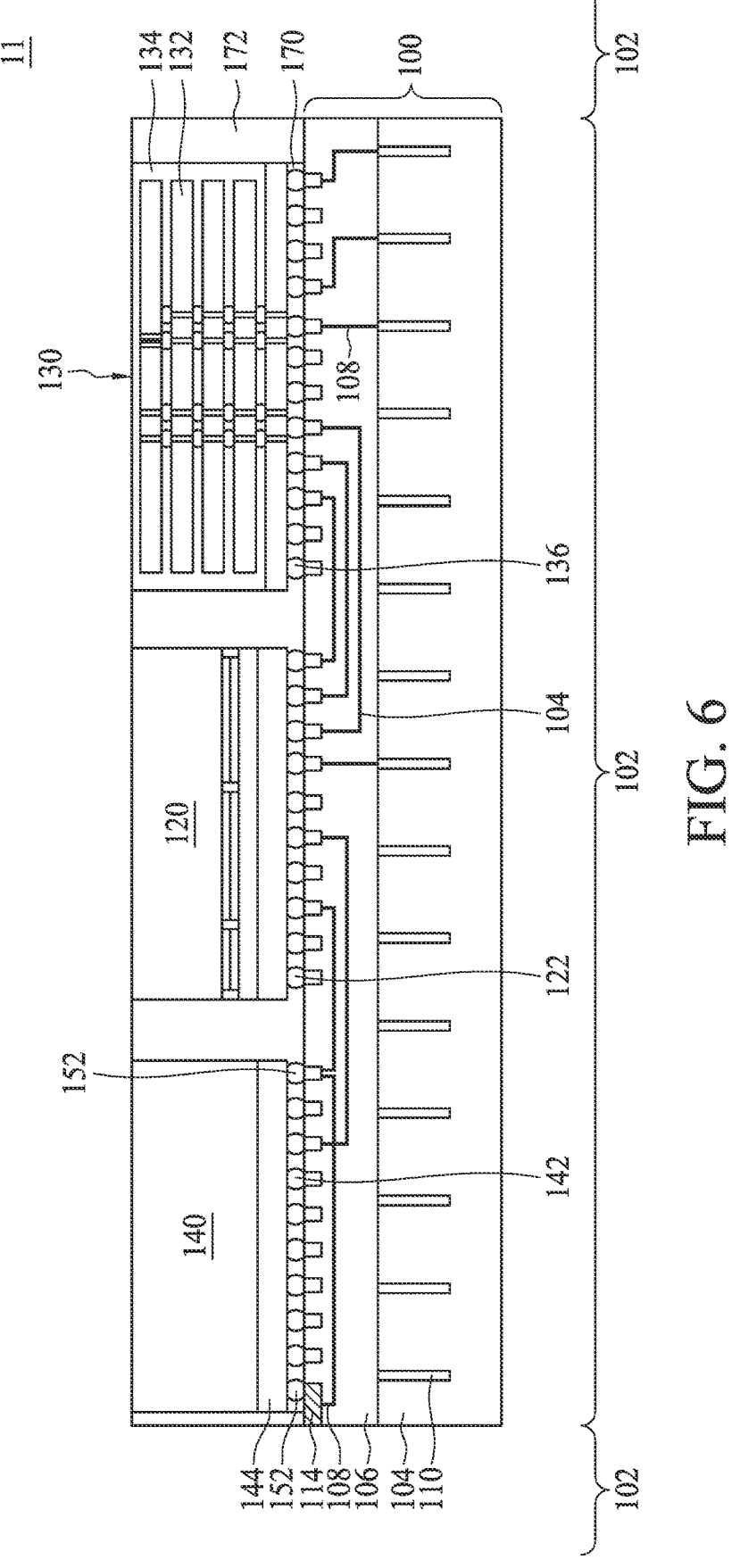

Referring to FIG. 6, in some embodiments, an underfill 170 may be dispensed and cured between the metal bumps 122, 136 and 142, the detecting bumps 152, and the interposer wafer 100. In some embodiments, an encapsulant 172 is dispensed and cured to surround the underfill 170 and the package components (i.e., the SoC package 120, the memory package 130 and the IPD package 140). The encapsulant 172 may include molding compound, molding underfill, epoxy, resin, and/or the like. In accordance with alternative embodiments, instead of disposing both the underfill 170 and the encapsulant 172, a molding underfill is disposed to act as both the underfill and the molding compound. After the encapsulant 172 is dispensed and cured, a planarization process such as a chemical mechanical polish (CMP) process or a mechanical grinding process is performed, so that the excess portions of the encapsulant 172 on top of the package components (e.g., the SoC package 120, the memory package 130 and the IPD package 140) are removed. In some embodiments, top surfaces of the SoC package 120, the memory package 130 and the IPD package 140 are exposed as a result of the planarization process, as shown in FIG. 6.

Figure 7:
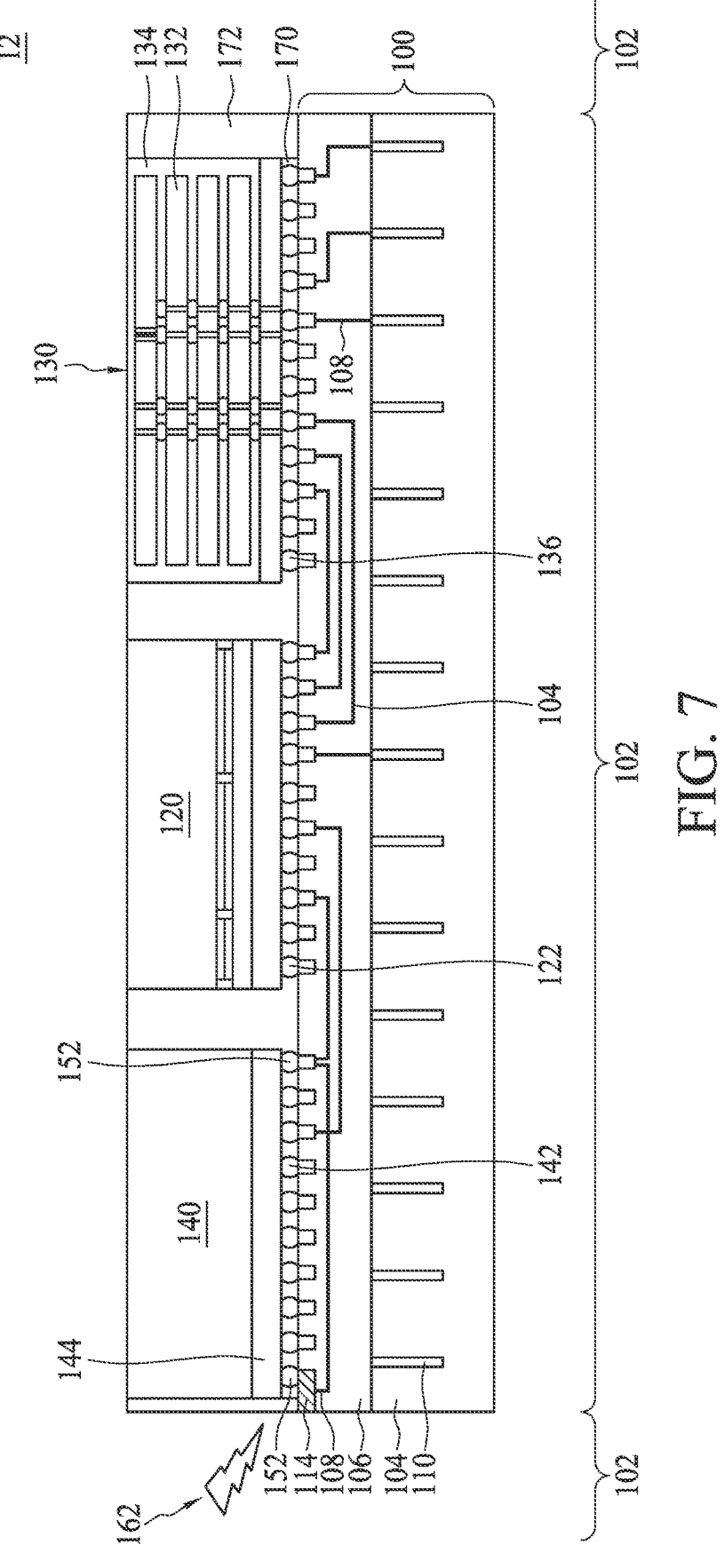

Referring to FIG. 7, during manufacturing, a test 162 may be performed to identify defective package components, such as the IPD package 140. It has been found that the IPD package 140 may suffer from cracking due to mechanical stress imposed during the CMP operation performed on the encapsulant 172. The crack may extend into the dielectric layer 144 and break the daisy chain 154 disposed in the dielectric layer 144. Therefore, the test 162 is performed using a probe to couple to the detecting device 150 of the IPD 140 package through the detecting pad 114 and the detecting bump 152. If the test 162 is failed, a defective IPD package 140 is recognized. Instead of discarding the defective package structures, it may be economically beneficial to repair the defective package structures through a rework process by, for example, removing the defective IPD package 140 and bonding a replacement IPD package 140 to the interposer 100.

Figure 8:
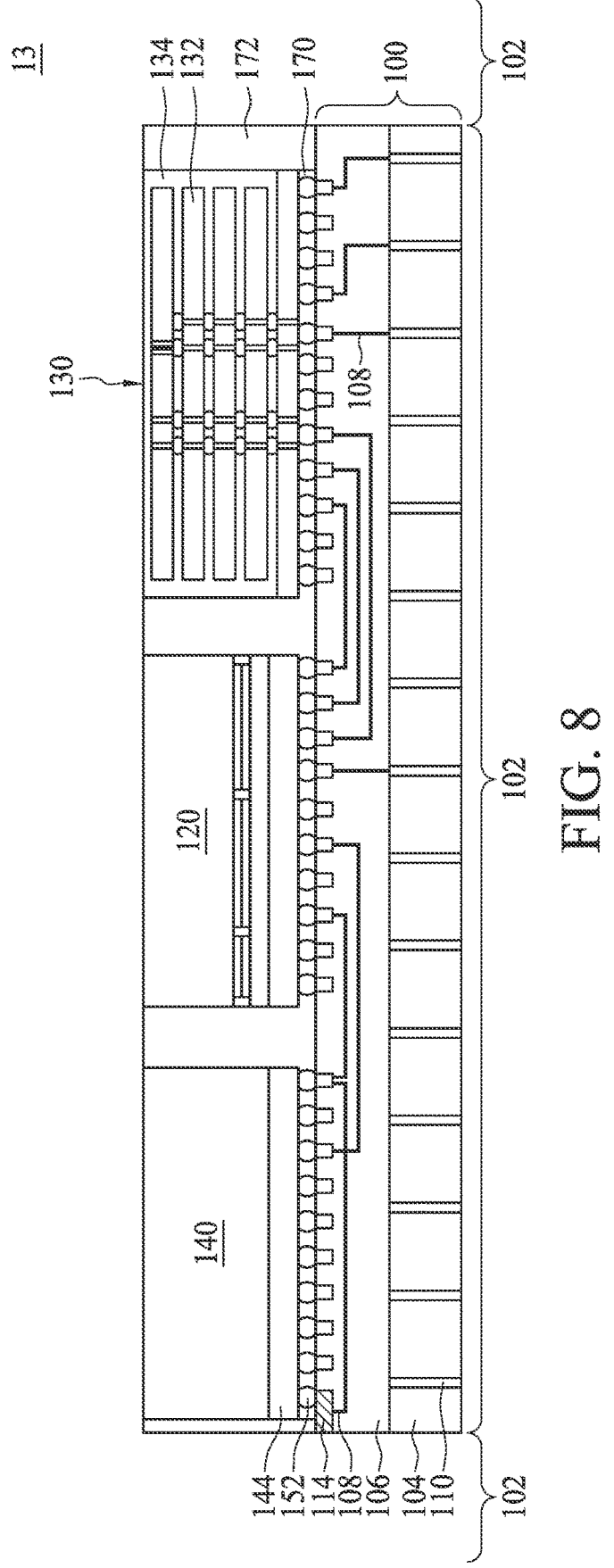

Referring to FIG. 8, in some embodiments, a backside grinding process is performed on the interposer wafer 100 to reveal the through vias 110. In some embodiments, a backside interconnect structure (not shown) may be formed on a backside of interposer 100 to electrically connect to the through-vias 110.

Figure 9:
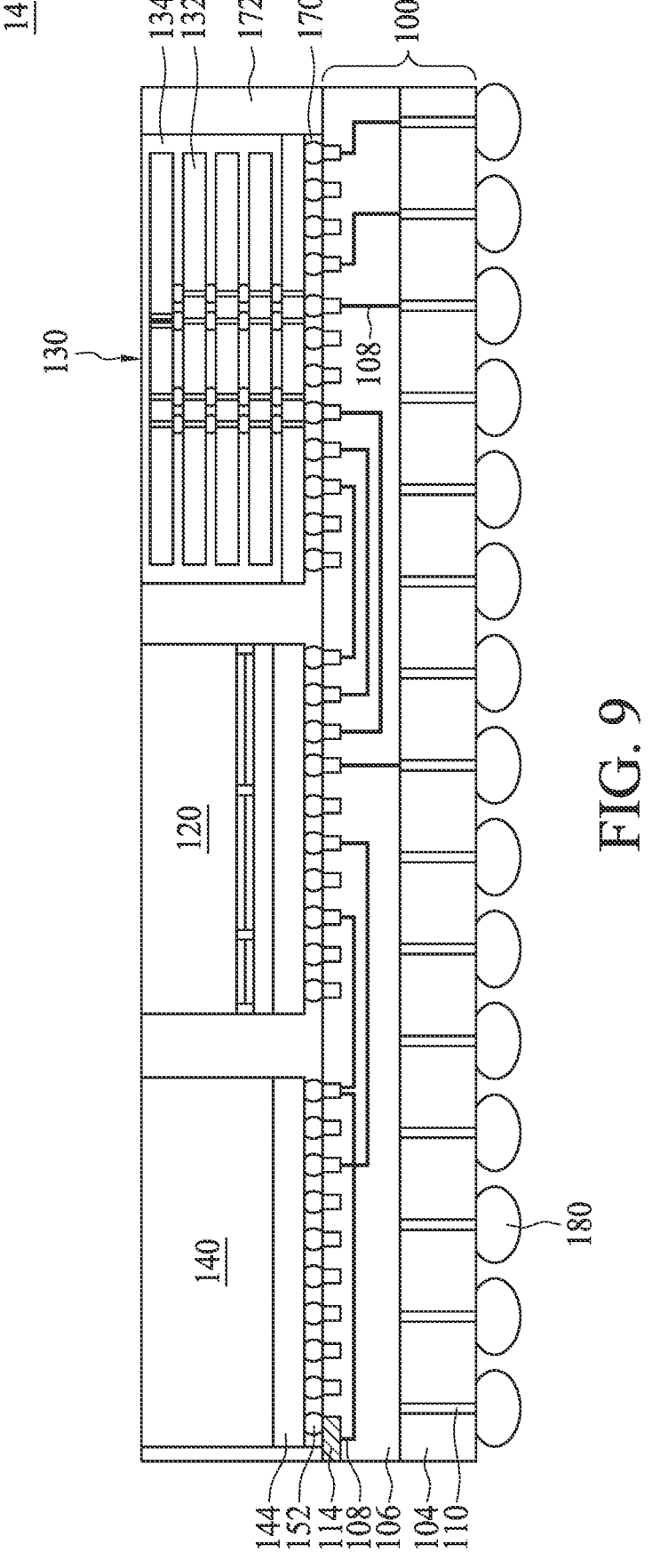

Referring to FIG. 9, in some embodiments, after the forming of the backside interconnect structure, a singulation operation may be performed to obtain a plurality of discrete packages, which are identical to each other. Further, a plurality of conductors 180 are formed under the interposer 100. As shown in FIG. 9, the conductors 180 are electrically connected to the through vias 110. In some embodiments, the conductors 180 are electrically connected to the through vias 110 through the backside interconnect structure, though not shown.

Figure 10:
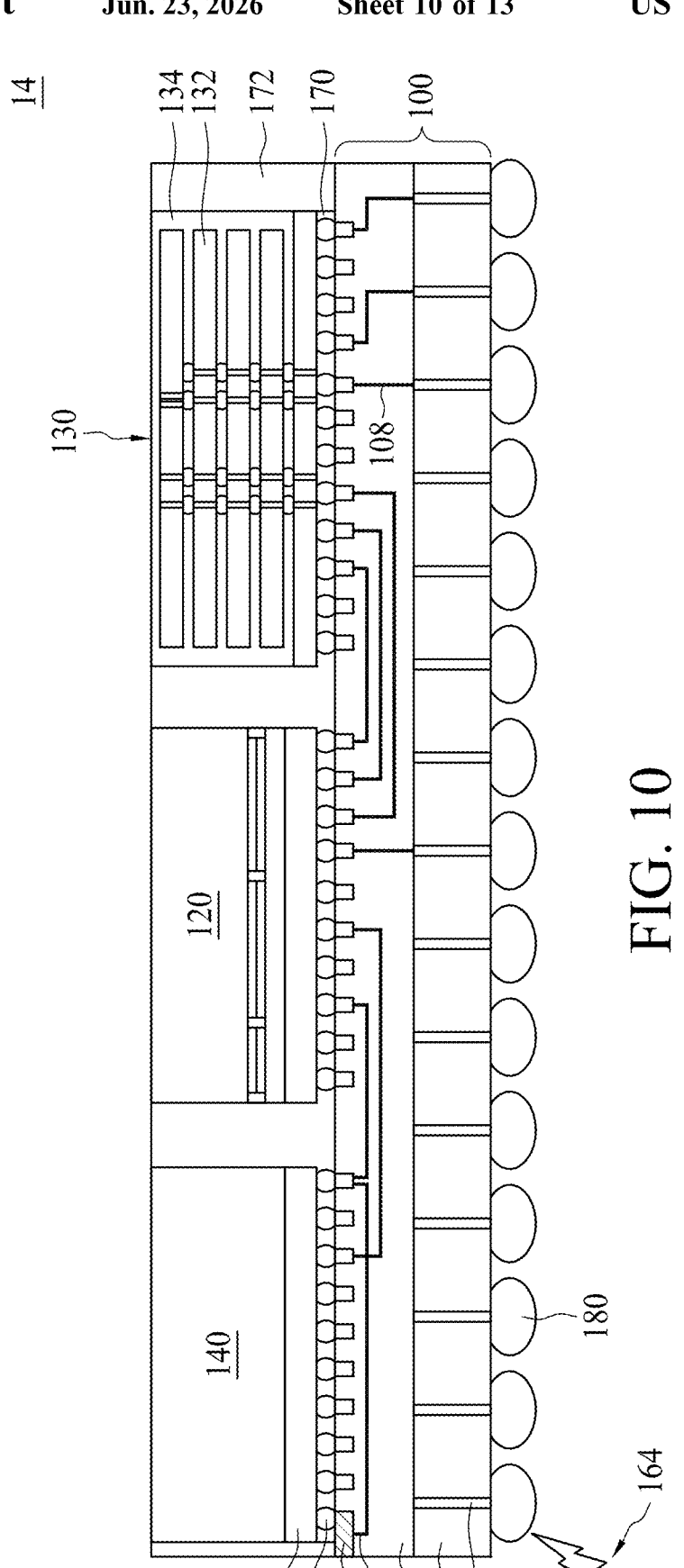

Referring to FIG. 10, during manufacturing, a test 164 may be performed to identify defective package components, such as the IPD package 140. It has been found that the IPD package 140 may suffer from cracking due to the mechanical stress imposed during the CMP operation performed on the backside of the interposer wafer 100. Therefore, the test 164 is performed using a probe to couple to the detecting device 150 of the IPD 140 through the conductors 180, the interposer 100, the detecting pad 114 and the detecting device 150. When a crack occurs, the crack may extend into the dielectric layer 144 and break the daisy chain 154; as a result, the test 164 is failed and the defective IPD package 140 with a cracking issue is recognized. Instead of discarding the defective package structures, it may be economically beneficial to repair the defective package structures through a rework process.

Figure 11:
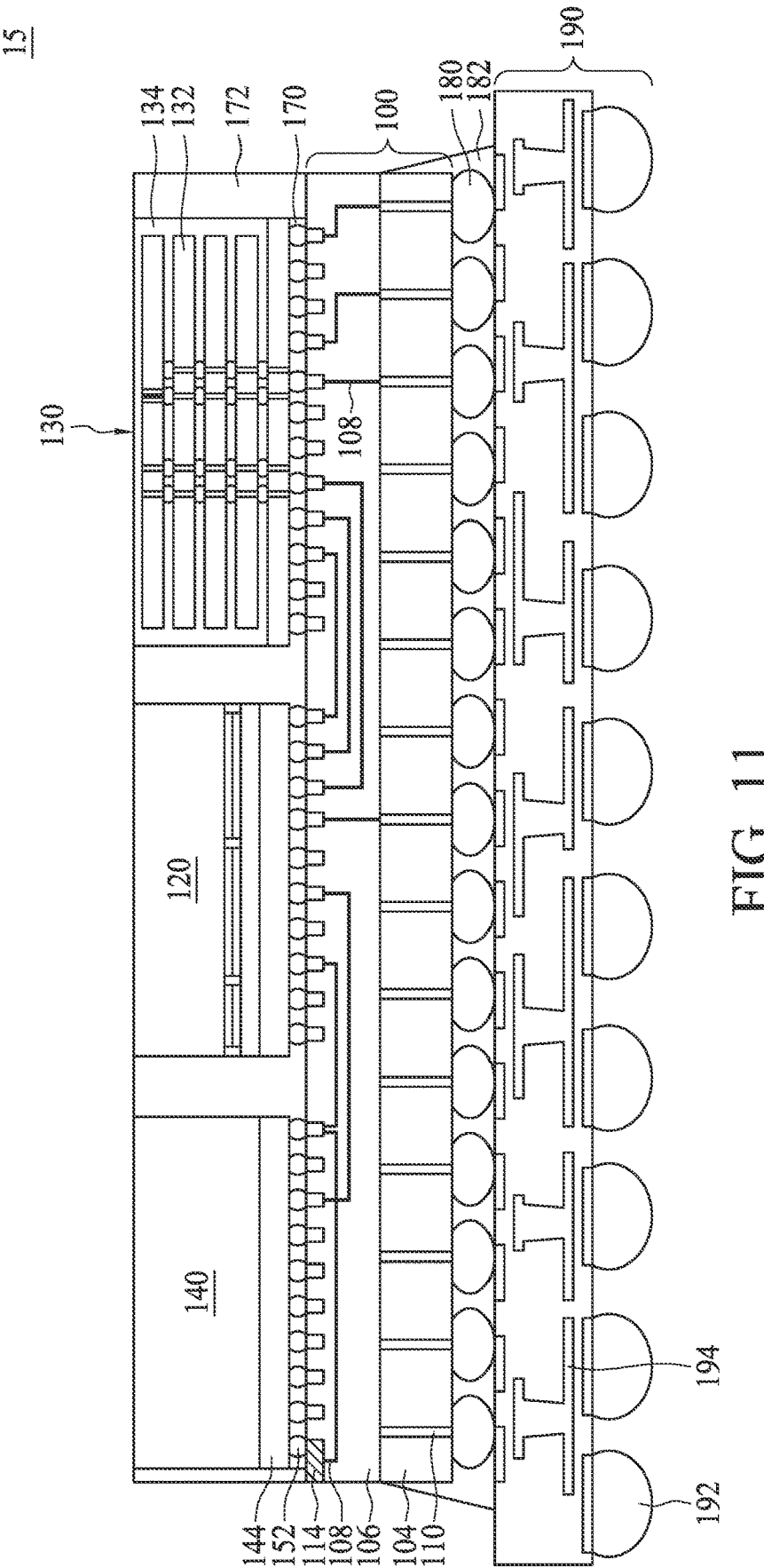

Referring to FIG. 11, in some embodiments, the discrete package is bonded to a package component 190 to form a semiconductor package structure 15. The bonding may be achieved through the conductors 180. In some embodiments, the package component 190 may be a package substrate (such as a coreless substrate or a substrate with a core), which includes electrical connectors 192 electrically connected to conductive lines 194 of the package component 190, and further electrically connected to the discrete package though the conductors 180. In some embodiments, the package component 190 may be of another type, such as a printed circuit board (PCB). Further, an underfill 182 is formed to fill vacancies between the conductors 180, the interposer 100 and the package component 190.

Figure 12:
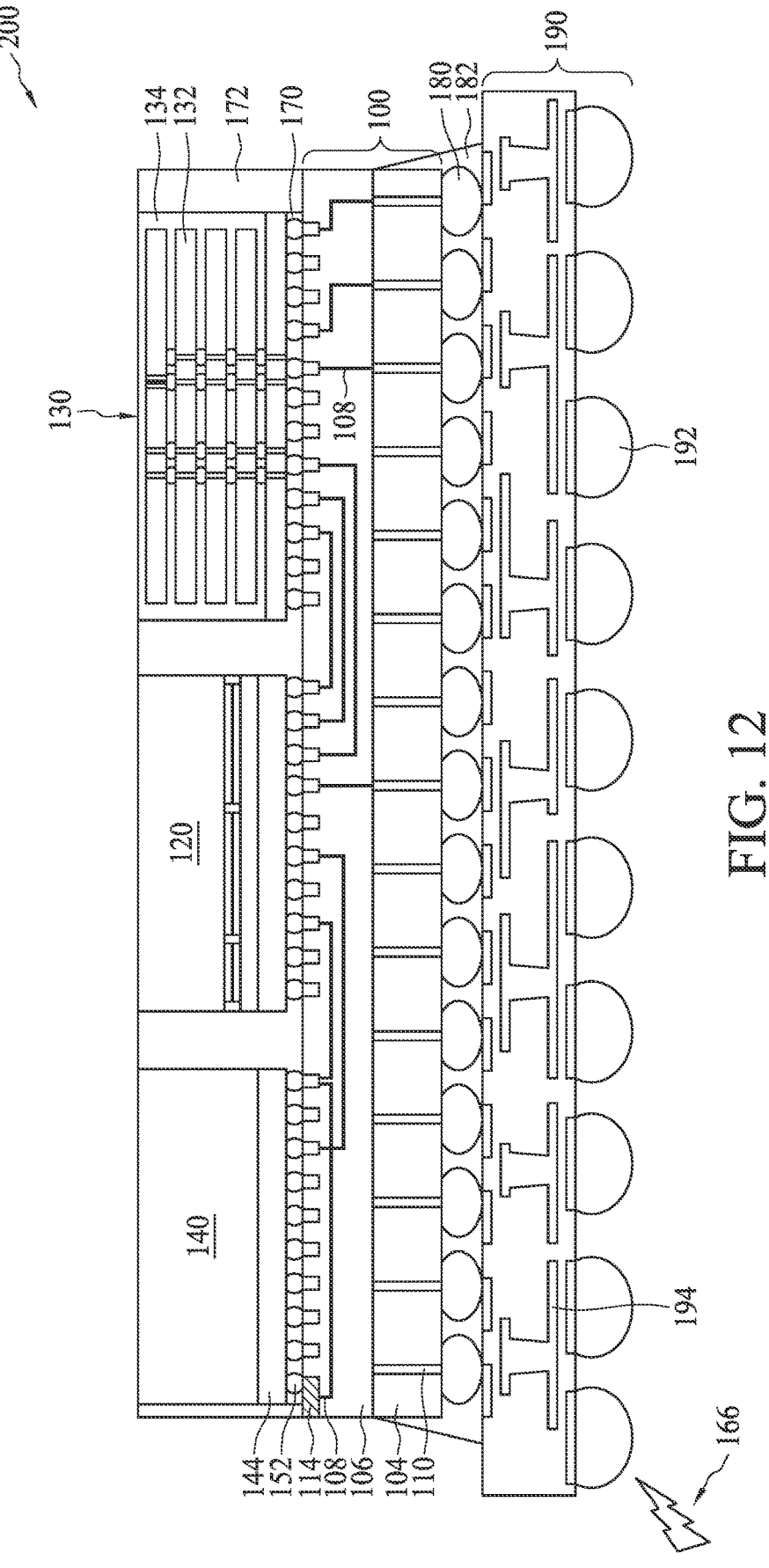

Referring to FIG. 12, during manufacturing, a test 166 may be performed to identify defective package components, such as the defective IPD packages 140. It has been found that the IPD package 140 may suffer from crack due to the mechanical stress imposed during the bonding to the package component 190. Therefore, the test 166 is performed using a probe to couple to the detecting device 150 of the IPD package 140 through the electrical connectors 192, the package component 190, the conductors 180, the interposer 100, the detecting pad 114 and the detecting device 150. When the daisy chain 154 of the detecting device 150 is broken due to a crack, the defective IPD package 140 with the crack issue is recognized. In some embodiments, a semiconductor package structure 200 is obtained when the test 166 is passed.

Referring to FIG. 13, a method for forming a semiconductor package structure 30 is provided. While the disclosed method 30 is illustrated and described herein as a series of acts or operations, it will be appreciated that an order of the illustrated acts or operations is not to be interpreted in a limiting sense. For example, some operations may occur in different orders and/or concurrently with other acts or operations apart from those illustrated and/or described herein. In addition, not all illustrated operations may be required to implement one or more aspects or embodiments of the description herein. Further, one or more of the operations depicted herein may be carried out in one or more separate operations and/or phases.

In operation 31, an IPD package is bonded to an interposer 100. FIGS. 1 and 2 illustrate cross-sectional views of the bonding of the IPD package to the interposer 100. Further, FIG. 2 illustrates a cross-sectional view of an intermediate semiconductor package structure 10 according to some embodiments corresponding to the operation 31. As also shown in FIGS. 1 and 2, other package components such as a device die, an SoC package 120, and a memory package 130 may be bonded to the interposer 100 before, during or after the operation 31. The SoC package 120, the memory package 130 and the IPD package 140 are disposed on a same side of the interposer 100, and electrically connected to the interposer 100.

In operation 32, a first test 160 is performed on the IPD package. FIG. 5 illustrates a cross-sectional view of the intermediate semiconductor package structure 10 during the first test 160 according to some embodiments corresponding to operation 32. As mentioned above, the first test 160 may be performed to identify defective IPD packages that suffer from cracking caused by the bonding; when the defective IPD packages has been identified, a rework operation may be performed. Instead of discarding the defective intermediate semiconductor package structure 10 or the final semiconductor package structure, it may be economically beneficial to repair the defective package structures through a rework process by, for example, removing the defective IPD 140 package and bonding a replacement IPD package 140 to the interposer 100.

In operation 33, the IPD package 140, the SoC package 120 and the memory package 130 are encapsulated. FIG. 6 illustrates a cross-sectional view of an intermediate semiconductor package structure 11 according to some embodiments corresponding to operation 33. In some embodiments, an underfill 170 may be dispensed to secure the bonding between the metal bumps 122, 136, 142 and the interposer 100 prior to the encapsulating. In other embodiments, an encapsulant 172 may be dispensed and cured without the underfill 170. A CMP operation is performed on the encapsulant 172 to remove excess portions of the encapsulant 172 and to reveal or expose top surfaces of the SoC package 120, the memory package 130 and the IPD package 140. Accordingly, a top surface of the encapsulant 172, the top surface of the SoC package 120, the top surface of the memory package 130 and the top surface of the IPD package 140 are aligned (i.e., coplanar) with each other.

In operation 34, a second test 162 is performed on the IPD package. FIG. 7 illustrates a cross-sectional view of an intermediate semiconductor package structure 12 during the second test 162 according to some embodiments corresponding to operation 34. As mentioned above, the second test 162 may be performed to find defective IPDs that suffer from cracking caused by the CMP operation performed on the encapsulant 172, and a rework operation may be performed when a defective IPD package is found. Instead of discarding the defective intermediate semiconductor package structure 12 or the final semiconductor package structure, it may be economically beneficial to repair the defective package structures through a rework process by, for example, removing the IPD package 140 and bonding a replacement IPD package 140 to the interposer 100, and re-encapsulating the intermediate semiconductor package structure 12.

In operation 35, a discrete package is formed. FIGS. 8 and 9 illustrate cross-sectional views of intermediate semiconductor package structures 13 and 14 according to some embodiments corresponding to operation 35. In some embodiments, a back side grinding is performed such that through vias 110 in the interposer 100 are exposed. In some embodiments, a back side interconnect structure may be formed to couple and electrically connect to the through vias 110, though not shown. In some embodiments, a plurality of conductors 180 may be formed to couple to the back side interconnect structure, wherein the conductors 180 are electrically connected to the through vias 110 through the back side interconnect structure. In some embodiments, a singulation is performed such that a plurality of identical discrete packages are obtained.

In operation 36, a third test 164 is performed on the IPD package. FIG. 10 illustrates a cross-sectional view of the intermediate semiconductor package structure 14 during the third test 164 according to some embodiments corresponding to operation 36. As mentioned above, the third test 164 may be performed to find defective IPD packages that suffer from cracking caused by the back side grinding, and a rework operation may be performed when a defective IPD package is found. Instead of discarding the defective final semiconductor package structure, it may be economically beneficial to monitor the intermediate semiconductor package structure 14.

In operation 37, the discrete package is bonded to a package component. FIG. 11 illustrates a cross-sectional view of an intermediate semiconductor package structure 15 according to some embodiments corresponding to operation 37. In some embodiments, the package component is bonded to the interposer 100 on a side opposite to the SoC package 120, the memory package 130 and the IPD package 140. As shown in FIG. 11, a plurality of electrical connectors 192 may be formed.

In operation 38, a fourth test 166 is performed on the IPD package. FIG. 12 illustrates a cross-sectional view of the semiconductor package structure 15 during the fourth test 166 according to some embodiments corresponding to operation 38. As mentioned above, the fourth test 166 is performed to find defective IPD packages or any other defects in the semiconductor package structure 15. A final semiconductor package structure 200 is obtained once the intermediate semiconductor package structure 15 passes the fourth test 166.

In some embodiments, the operation 32 may be omitted. In such embodiments, the tests 162, 164 and 166 may be performed on the IPD package 140 after the operation 33, the operation 35 and the operation 37, respectively.

In some embodiments, the operation 34 may be omitted. In such embodiments, the tests 160, 164 and 166 may be performed on the IPD package after the operation 31, the operation 35 and the operation 37, respectively.

In some embodiments, the operation 36 is omitted. In such embodiment, the tests 160, 162 and 166 may be performed on the IPD package after the operation 31, the operation 33 and the operation 37.

In some embodiments, the operation 34 and the operation 36 are omitted. In such embodiments, the tests 160 and 166 may be performed on the IPD package after the operation 31 and the operation 37.

Accordingly, the present disclosure provides a semiconductor package structure including detecting devices and a method for forming the same. According to the method, the semiconductor package structure is monitored during manufacturing processes to identify defective package structures. Based on such monitoring, it can be determined whether it is economically beneficial to repair the defective package structures through a rework process instead of discarding a completed but defective semiconductor package structure.

In some embodiments, a semiconductor package structure is provided. The semiconductor package structure includes an interposer, an IPD package, a plurality of detecting bumps, and a plurality of daisy chains. The interposer includes at least a detecting pad and a plurality of bonding pads. The IPD package includes a plurality of metal bumps. The detecting bumps are disposed in the IPD package and separated from the metal bumps of the IPD package. The daisy chains are disposed in the IPD package and electrically connected to the detecting bumps.

In some embodiments, a semiconductor package structure is provided. The semiconductor package structure includes an interposer, a device die, a memory package, an IPD package, at least a detecting device, and a package component. The interposer includes a plurality of bonding pads and at least a detecting pad. The device die, the memory package, the IPD package and the package component are electrically connected to the interposer through the bonding pads of the interposer. The detecting device is disposed in the IPD package and electrically connected to the detecting pad of the interposer.

In some embodiments, a method for forming a semiconductor package structure is provided. The method includes following operations. An IPD package is bonded to an interposer. The IPD package and the interposer are encapsulated. A first test is performed on the IPD package. The IPD package and the interposer are bonded to a package component after the first test.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure, comprising:

bonding an integrated passive device (IPD) package and a plurality of memory dies to an interposer, wherein the plurality of memory dies are stacked and bonded together, and enveloped in a first encapsulant;

encapsulating the IPD package, the plurality of memory dies, the first encapsulant and the interposer in a second encapsulant;

performing a first test on the IPD package; and bonding the IPD package and the interposer to a package component after the first test.

2. The method of claim 1, wherein the encapsulating of the IPD package and the interposer comprises:

dispensing the second encapsulant between the IPD package and the interposer; and removing a portion of the second encapsulant to expose a top surface of the IPD package.

3. The method of claim 1, further comprising bonding a device die to the interposer.

4. The method of claim 1, further comprising performing a second test on the IPD package prior to encapsulating.

5. The method of claim 1, further comprising performing a third test on the IPD package after the bonding of the IPD package and the interposer to the package component.

6. The method of claim 1, wherein the IPD package comprises a detecting device bonded to the interposer.

7. The method of claim 6, wherein the detecting device comprises a plurality of detecting bumps and a plurality of daisy chains.

8. A method for forming a semiconductor package structure, comprising:

receiving an interposer comprising at least a bonding pad and a detecting pad;

bonding an integrated passive device (IPD) package and a plurality of memory dies to the interposer, wherein the IPD package comprises a detecting device, and the plurality of memory dies are stacked and bonded together and enveloped in a first encapsulant;

performing a first test on the detecting device of the IPD package;

encapsulating the IPD package, the plurality of memory dies, the first encapsulant and the interposer;

performing a second test on the detecting device of the IPD package; and bonding the IPD package and the interposer to a package component after the second test.

9. The method of claim 8, wherein the interposer further comprises at least a through via.

10. The method of claim 9, further comprising:

thinning the interposer to expose the through via; and forming a conductor coupled to the through via, wherein the conductor is electrically connected to the detecting device.

11. The method of claim 10, further comprising performing a third test on the detecting device through the conductor.

12. The method of claim 8, further comprising bonding a device die to the interposer.

13. The method of claim 8, wherein the encapsulating of the IPD package and the interposer comprises:

dispensing a second encapsulant between the IPD package and the interposer; and removing a portion of the second encapsulant to expose a top surface of the IPD package.

14. A method for forming a semiconductor package structure, comprising:

receiving an interposer, wherein the interposer comprises at least a through via;

bonding an integrated passive device (IPD) package and a plurality of memory dies to the interposer, wherein the IPD package comprises a detecting device, and the plurality of memory dies are stacked, bonded together and enveloped in a first encapsulant;

encapsulating the IPD package, the plurality of memory dies and the interposer;

performing a first test on the detecting device of the IPD package; and bonding the IPD package and the interposer to a package component after the first test.

15. The method of claim 14, wherein the first test is performed prior to the encapsulating of the IPD package the interposer.

16. The method of claim 14, wherein the first test is performed after the encapsulating of the IPD package the interposer.

17. The method of claim 14, further comprising:

thinning the interposer to expose the through via; and forming a conductor coupled to the through via, wherein the conductor is electrically connected to the detecting device.

18. The method of claim 17, further comprising performing a second test on the detecting device through the conductor.

19. The method of claim 14, wherein the package component has a first side facing the interposer and a second side opposite to the first side, and the package component comprises at least an electrical connector disposed on the second side.

20. The method of claim 19, further comprising performing a third test on the electrical connector.

* * * * *